US010460911B2

(12) United States Patent
Ziemba et al.

(10) Patent No.: US 10,460,911 B2
(45) Date of Patent: *Oct. 29, 2019

(54) HIGH VOLTAGE RESISTIVE OUTPUT STAGE CIRCUIT

(71) Applicant: Eagle Harbor Technologies, Inc., Seattle, WA (US)

(72) Inventors: Timothy M. Ziemba, Bainbridge Island, WA (US); Kenneth E. Miller, Seattle, WA (US); James R. Prager, Seattle, WA (US); John G. Carscadden, Seattle, WA (US); Ilia Slobodov, Seattle, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/178,538

(22) Filed: Nov. 1, 2018

(65) Prior Publication Data
US 2019/0080884 A1    Mar. 14, 2019

Related U.S. Application Data

(63) Continuation of application No. 15/941,731, filed on Mar. 30, 2018.
(Continued)

(51) Int. Cl.
*H01J 37/32*    (2006.01)
*H03K 3/021*    (2006.01)
*H03K 3/57*    (2006.01)

(52) U.S. Cl.
CPC .. *H01J 37/32174* (2013.01); *H01J 37/32091* (2013.01); *H01J 37/32348* (2013.01);
(Continued)

(58) Field of Classification Search
None
See application file for complete search history.

(56) References Cited

U.S. PATENT DOCUMENTS

| 4,070,589 A | 1/1978 | Martinkovic |
| 4,504,895 A | 3/1985 | Steigerwald |
| (Continued) | | |

OTHER PUBLICATIONS

International Search Report and Written Opinion, as issued in connection with International Patent Application No. PCT/US2018/016993, dated Apr. 18, 2018, 10 pgs.
(Continued)

*Primary Examiner* — Dion Ferguson
*Assistant Examiner* — Srinivas Sathiraju

(57) ABSTRACT

Some embodiments include a high voltage, high frequency switching circuit. The switching circuit may include a high voltage switching power supply that produces pulses having a voltage greater than 1 kV and with frequencies greater than 10 kHz and an output. The switching circuit may also include a resistive output stage electrically coupled in parallel with the output and between the output stage and the high voltage switching power supply, the resistive output stage comprising at least one resistor that discharges a load coupled with the output. In some embodiments, the resistive output stage may be configured to discharge over about 1 kilowatt of average power during each pulse cycle. In some embodiments, the output can produce a high voltage pulse having a voltage greater than 1 kV and with frequencies greater than 10 kHz with a pulse fall time less than about 400 ns.

28 Claims, 13 Drawing Sheets

Related U.S. Application Data

(60) Provisional application No. 62/480,115, filed on Mar. 31, 2017.

(52) U.S. Cl.
CPC ............... *H03K 3/021* (2013.01); *H03K 3/57* (2013.01); *H01J 2237/2485* (2013.01)

(56) References Cited

U.S. PATENT DOCUMENTS

| | | | | |
|---|---|---|---|---|
| 4,992,919 | A * | 2/1991 | Lee | H02M 3/3376 363/132 |
| 5,140,510 | A * | 8/1992 | Myers | H02M 3/33569 363/132 |
| 5,451,846 | A * | 9/1995 | Peterson | H02P 5/68 318/400.26 |
| 5,610,452 | A | 3/1997 | Shimer et al. | |
| 5,796,598 | A | 8/1998 | Nowak et al. | |
| 6,392,187 | B1 | 5/2002 | Johnson | |
| 6,483,731 | B1 | 11/2002 | Isurin et al. | |
| 6,947,300 | B2 * | 9/2005 | Pai | H02M 7/493 363/65 |
| 8,129,653 | B2 * | 3/2012 | Kirchmeier | H01J 37/32045 219/121.36 |
| 9,306,533 | B1 * | 4/2016 | Mavretic | H03H 7/40 |
| 9,706,630 | B2 * | 7/2017 | Miller | H02M 7/5387 |
| 2003/0137791 | A1 | 7/2003 | Arnet et al. | |
| 2005/0152159 | A1 * | 7/2005 | Isurin | H02M 1/36 363/17 |
| 2007/0114981 | A1 | 5/2007 | Vasquez et al. | |
| 2008/0252225 | A1 * | 10/2008 | Kurachi | H02M 3/3378 315/219 |
| 2008/0272706 | A1 | 11/2008 | Kwon et al. | |
| 2009/0016549 | A1 | 1/2009 | French et al. | |
| 2012/0081350 | A1 | 4/2012 | Sano et al. | |
| 2013/0175575 | A1 * | 7/2013 | Ziemba | H03K 17/567 257/140 |
| 2014/0077611 | A1 | 3/2014 | Young et al. | |
| 2015/0084509 | A1 * | 3/2015 | Yuzurihara | H01J 37/32082 315/111.21 |
| 2015/0130525 | A1 * | 5/2015 | Miller | H03K 3/57 327/304 |
| 2015/0256086 | A1 * | 9/2015 | Miller | H02M 7/5387 363/21.01 |
| 2015/0318846 | A1 * | 11/2015 | Prager | H03K 17/005 327/304 |
| 2016/0020072 | A1 * | 1/2016 | Brouk | H01J 37/32091 156/345.28 |
| 2016/0241234 | A1 * | 8/2016 | Mavretic | G01R 19/165 |
| 2016/0327029 | A1 * | 11/2016 | Ziemba | F03H 1/0087 |
| 2017/0243731 | A1 * | 8/2017 | Ziemba | H01J 65/048 |
| 2017/0294842 | A1 * | 10/2017 | Miller | H02M 7/5387 |
| 2017/0311431 | A1 * | 10/2017 | Park | C23C 16/45557 |
| 2017/0359886 | A1 * | 12/2017 | Binderbauer | G21B 1/052 |
| 2018/0286636 | A1 * | 10/2018 | Ziemba | H03K 3/57 |
| 2019/0080884 | A1 * | 3/2019 | Ziemba | H03K 3/57 |
| 2019/0157044 | A1 * | 5/2019 | Ziemba | H01J 37/32174 |

OTHER PUBLICATIONS

International Search Report and Written Opinion, as issued in connection with International Patent Application No. PCT/US2018/25440, dated Jun. 25, 2018, 25 pgs.

* cited by examiner

HIGH VOLTAGE RESISTIVE OUTPUT STAGE CIRCUIT

BACKGROUND

Producing high voltage pulses with fast rise times and/or fast fall times is challenging. For instance, to achieve a fast rise time and/or a fast fall time (e.g., less than about 50 ns) for a high voltage pulse (e.g., greater than about 5 kV), the slope of the pulse rise and/or fall must be incredibly steep (e.g., greater than $10^{-11}$ V/s). Such steep rise times and/or fall times are very difficult to produce especially in circuits driving a load with low capacitance. Such pulse may be especially difficult to produce using standard electrical components in a compact manner; and/or with pulses having variable pulse widths, voltages, and repetition rates; and/or within applications having capacitive loads such as, for example, a plasma.

SUMMARY

Some embodiments include a high voltage, high frequency switching circuit. The switching circuit may include a high voltage switching power supply that produces pulses having a voltage greater than 1 kV and with frequencies greater than 10 kHz and an output. The switching circuit may also include a resistive output stage electrically coupled in parallel with the output and between the output stage and the high voltage switching power supply, the resistive output stage comprising at least one resistor that discharges a load coupled with the output. In some embodiments, the resistive output stage may be configured to discharge over about 1 kilowatt of average power during each pulse cycle. In some embodiments, the output can produce a high voltage pulse having a voltage greater than 1 kV and with frequencies greater than 10 kHz with a pulse fall time less than about 400 ns.

In some embodiments, the high voltage switching power supply may comprise a power supply, at least one switch, and a step-up transformer.

In some embodiments, the resistive output stage may comprise an inductor.

In some embodiments, the resistance of the resistor in the resistive output stage may be less than 200 ohms.

In some embodiments, the resistor may comprise a plurality of resistors arranged in series or parallel having a combined capacitance less than about 200 pF.

In some embodiments, the resistive output stage includes an inductor and a resistor, and wherein the inductance L of the inductor and the resistance R of the resistor are set to satisfy $L/R \approx tp$, where tp is the pulse width of the pulse.

In some embodiments, the resistor in the resistive output stage has a resistance R and the output is coupled with a load having a capacitance C such that $R \approx C/tf$ where tf is the pulse fall time.

In some embodiments, the resistor in the resistive output stage includes has a resistance R and the output is coupled with a load having a capacitance C such that $R \approx C/tr$ where tr is the pulse rise time.

In some embodiments, the resistive output stage includes a blocking diode.

In some embodiments, the output produces a high-voltage, negative bias voltage within a plasma when the high voltage switching power supply is not providing a high voltage pulse.

In some embodiments, the output can produce a high voltage pulse having a voltage greater than 1 kV and with frequencies greater than 10 kHz with a pulse fall time less than about 250 ns.

In some embodiments, the high voltage, high frequency switching circuit may be coupled with a load that is capacitive in nature with a capacitance less than 50 nF, wherein the load capacitance does not hold charges for times greater than 10 μs.

In some embodiments, the high voltage, high frequency switching circuit may be coupled with a load that is capacitive in nature and the high voltage, high frequency switching circuit rapidly charges the load capacitance and discharges the load capacitance Some embodiments may include high voltage, high frequency switching circuit that includes a high voltage switching power supply that produces pulses having a voltage greater than 1 kV and with frequencies greater than 10 kHz; an output; and a resistive output stage electrically coupled to, and in parallel with the output of the high voltage switching power supply, the resistive output stage comprising at least one resistor.

In some embodiments, the output can produce a high voltage pulse having a voltage greater than 1 kV with frequencies greater than 10 kHz and with pulse fall times less than about 400 ns, and wherein the output is electrically coupled to a plasma type load.

In some embodiments, the plasma type load can be modeled as having capacitive elements less than 20 nF in size.

In some embodiments, a potential is established to accelerate ions into a surface through the action of the high voltage high frequency switching power supply In some embodiments, the plasma type is largely capacitive in nature.

In some embodiments, the plasma type load includes a dielectric barrier discharge.

In some embodiments, the high voltage high frequency switching power supply delivers peak powers greater than 100 kW.

In some embodiments, the high voltage switching power supply comprises a power supply, at least one switch, and a step-up transformer.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

Figure 1:
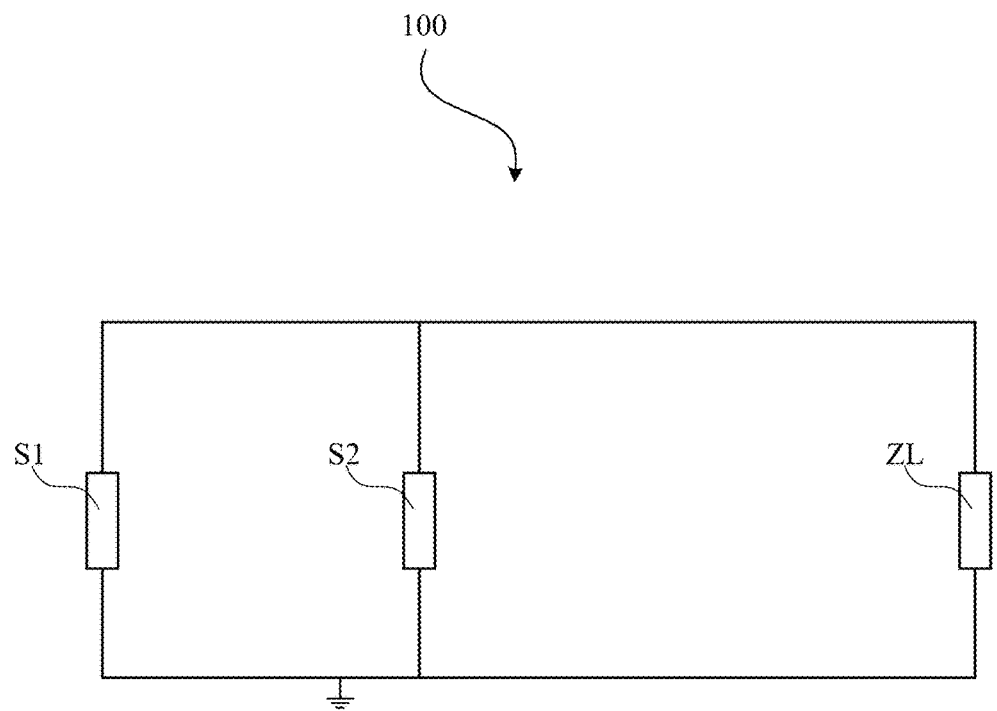
FIG. 1 is an example circuit that can be used to control the voltage on a load according to some embodiments.

In some embodiments, a resistive output stage is a collection of circuit elements that can be used to control the shape of a voltage waveform on a load. In some embodiments, a resistive output stage may include passive elements only (e.g., resistors, capacitors, inductors, etc.); and in other embodiments a resistive output stage may include active circuit elements (e.g., switches) as well as passive circuit elements. In some embodiments, a resistive output stage, for example, can be used to control the voltage rise time of a waveform and/or the voltage fall time of waveform. In the associated figures, examples of resistive output stages are shown and are represented by different symbols such as R, Zp, ZL, ZC, etc. These are examples and should not be viewed as to limit the varieties of resistive output stages covered in the various embodiments described in this document.

In some embodiments, a resistive output stage can discharge capacitive loads. For example, these capacitive loads may have small capacitance (e.g., about 10 pF, 100 pF, 500 pF, 1 nF, 10 nF, 100 nF, etc.). As another example, a rapid discharge is a pulse having a fall time that is shorter than about 1 ns, 10 ns, 50 ns, 100 ns, 250 ns, 500 ns, 1,000 ns, etc.

In some embodiments, a resistive output stage can be used in circuits with pulses having a high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

Indeed, as used throughout this disclosure, the term "high voltage" may include a voltage greater than 1 kV, 10 kV, 20 kV, 50 kV, 100 kV, etc.; the term "high frequency" may be a frequency greater than 1 kHz, 10 kHz, 100 kHz, 200 kHz, 500 kHz, 1 MHz, etc., the term "fast rise time" may include a rise time less than about 1 ns, 10 ns, 50 ns, 100 ns, 250 ns, 500 ns, 1,000 ns, etc.; the term "fast fall time" may include a fall time less than about 1 ns, 10 ns, 50 ns, 100 ns, 250 ns, 500 ns, 1,000 ns, etc.); and the term short pulse width may include pulse widths less than about 1 ns, 10 ns, 50 ns, 100 ns, 250 ns, 500 ns, 1,000 ns, etc.).

Additionally, the term 'rise time' may be understood to describe the application of voltage and/or charge/and/or energy and/or current to the circuit at the beginning of the pulse, irrespective of whether the pulse is positive going of negative going with respect to ground. Similarly, the term 'fall time' may be understood to describe the application of voltage and/or charge/and/or energy and/or current to the circuit at the end of the pulse, irrespective of whether the pulse is positive going of negative going with respect to ground.

FIG. 1 is an example circuit 100 that can be used to control the voltage on a load ZL, which may be the circuit/system load. The load ZL may be a capacitor, a capacitor in series with a resistor, a capacitor in series with an inductor, a dielectric barrier discharge, a plasma load, a semiconductor wafer processing load, and any arbitrary arrangement of capacitors, inductors, resistors, and/or other active and/or passive components, etc. In some embodiments, the load ZL may include any load that when voltage is applied, and charge is delivered, the charge/voltage may remain present for longer than desired (e.g., longer than the designed or desired fall time). For instance, this may often occur in high voltage switching applications.

In some embodiments, the switch S1 may be a single switch, a series stack of switches, a switching power supply, a pulser, a microsecond pulser, an arbitrary pulse generator, or any system that may be used to apply a high voltage, time varying power to the load ZL with the parameters noted above. In some embodiments, the switch S1 can deliver pulses to the load (e.g., charge or power to the load ZL and/or establish a voltage on the load ZL) at high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

In some embodiments, the switch S2 may be a single switch, a series stack of switches, or any other arrangement of active elements that can be used to remove charge from the load ZL and/or reduce the voltage across the load ZL. In some embodiments, the switch S2 may be used to remove charge from the load ZL when the switch S1 is open. In some embodiments, the switch S2 may be coupled with a resistor.

Figure 2:
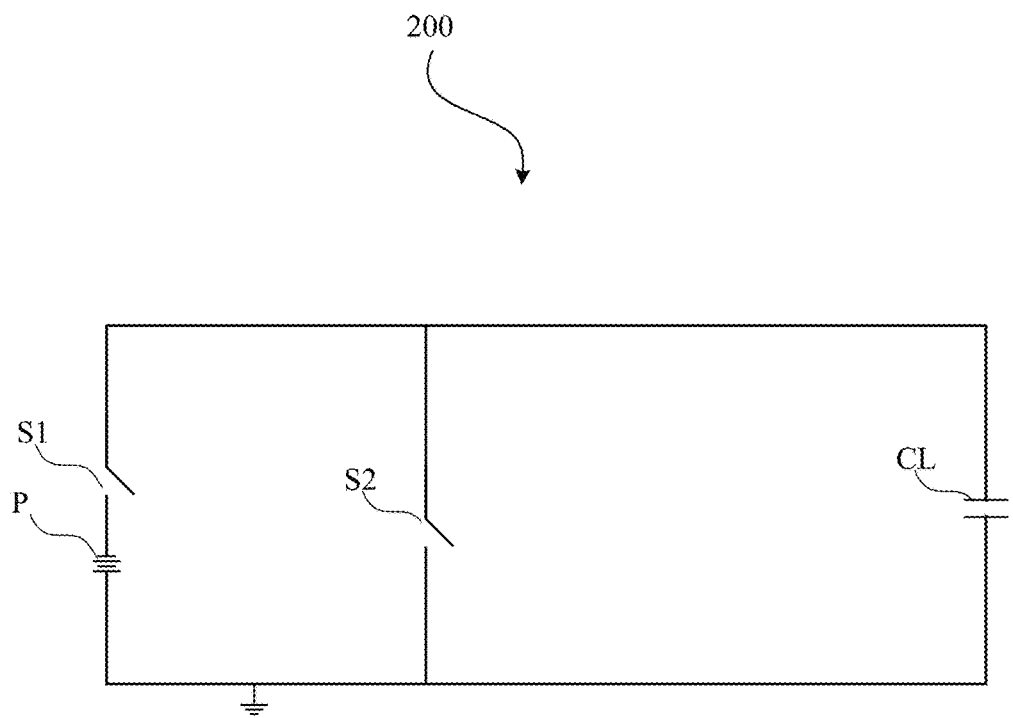
FIG. 2 is an example circuit that can be used to control the voltage on a load according to some embodiments.

FIG. 2 is another example circuit 200 according to some embodiments. In this example, the switch S1 may be in series with a DC power supply P and/or may include a transformer or other circuit elements. the switch S1, can include a solid-state switch such as, for example, an IGBT, GaN, MOSFET, etc. switch. the switch S2 may be a switch (e.g., a high voltage switch), and the load ZL may be represented as a capacitive load CL.

Pulses from the switch S1 and the power supply P may be delivered in the following manner. When the switch S1 is closed and switch S2 is open, charge is delivered to capacitive load CL and the voltage on the capacitive load CL increases to some value V, set by the power supply P. When the switch S1 is opened, the charge/voltage will remain on capacitive load CL until the switch S2 is closed and the voltage/charge is discharged from the capacitive load CL. The pulses from the switch S1 and the power supply P may include high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

In some embodiments, there may be an asymmetry between the switch S1 and the switch S2. For example, many different topologies can be used to create a voltage source (the switch S1) that has a high voltage output compared to the voltage hold off rating of the actual switches used. For example, the switch S1 may include a 600 V switch combined with a 10:1 Step up transformer that together produces an output voltage of 6 kV. In this example, the switch S2 would need to be a 6 kV rated switch. While a 600 V switch may be common, a 6 kV switch is uncommon. In this example, the switch S2 must hold off 6 kV until it is closed and removes the charge/voltage from the load CL. This asymmetry between the switch S1 and the switch S2 may be especially problematic with solid-state switches, for example IGBTs, GaN switches, MOSFETs, etc. It can be even more problematic when fast switching transition times are required, and/or high frequency operation is required, and/or high voltage operation is required, since often switches with the required propertied do not exist.

Figure 3:
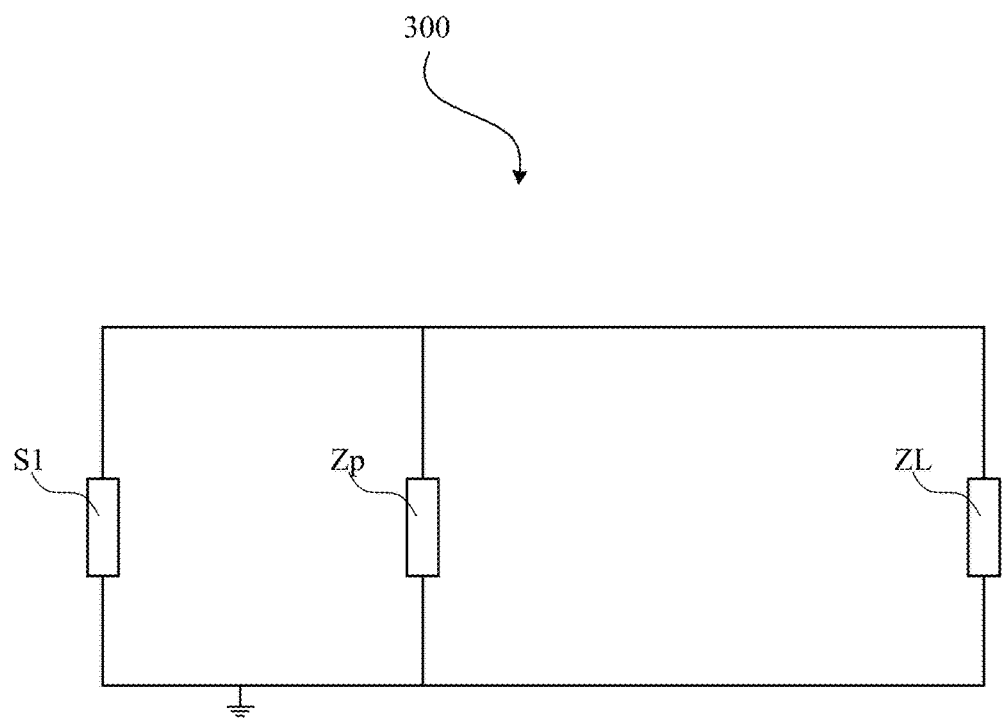
FIG. 3 is an example circuit that can be used to control the voltage on a load according to some embodiments.

FIG. 3 is a circuit 300, for example, that can be used to overcome the asymmetry between the switch S1 and the switch S2, and/or the challenges of operating the switch S2 at high frequency, high voltage, and/or with fast rise/fall times. The switch S1 may be a switch in series with a DC power supply (e.g., as shown in FIG. 2) and/or may include a transformer. The switch S1, for example, can include a solid-state switch such as, for example, an IGBT, GaN, MOSFET, etc. switch. The circuit element Zp may comprise a resistive output stage that may include a combination of resistors, capacitors, diodes, and/or inductors. In some embodiments, the circuit element Zp may include a series and/or parallel arrangement of passive elements (i.e. resistors, capacitors, inductors, diodes, etc.). In some embodiments, Zp may be purely resistive in nature. In some embodiments, the circuit element Zp may replace the functionality of the switch S2. For example, the circuit element Zp may allow charge and/or voltage to be removed from the load ZL at high frequency, high voltage, fast rise times, and/or fast fall times. In terms of voltage, frequency, rise time, and fall time, passive elements may have fewer constraints compared with solid state switches.

Figure 4:
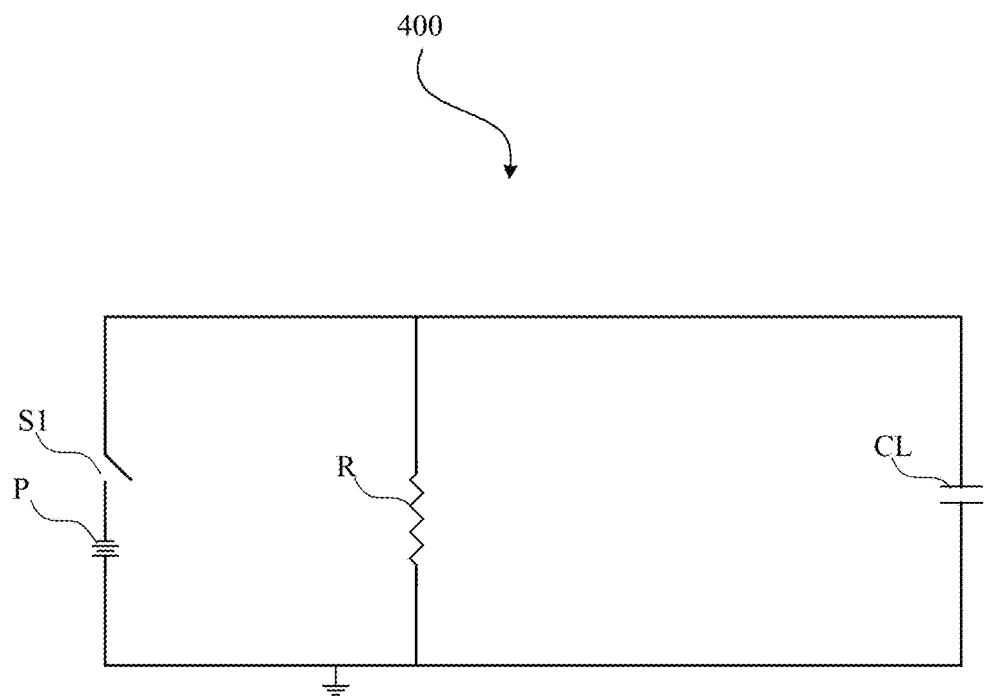
FIG. 4 is an example circuit with a resistive output stage according to some embodiments.

FIG. 4 is an example circuit 400 where circuit element Zp is represented as a resistor R. In this example, the switch S1 closes and establishes a voltage V across capacitive load CL that is set by the power supply P. While the switch S1 is closed, power supply P may maintain the voltage V across resistor R and load CL. Once the switch S1 opens, the charge/voltage on the capacitive load CL can be removed by the resistor R, on a timescale set by the product of (R) and (CL) which is commonly simply known as an RC timescale. If R was 100 Ohms and C was 1 nF than the characteristic voltage fall time given by RC would be 100 ns. The resistor R can operate in a high voltage, high frequency, fast rise time, and/or fast fall time parameter space within which few to no switches can operate.

For example, resistor R can remove charge/voltage from capacitive load CL at 6 kV, 100 kHz, and/or with a 100 ns fall time. Resistor R, for example, could be selected to remove charge at high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.). This set of voltages, frequencies, rise times, and/or fall times may cover a space not accessible by any existing solid-state switch.

In some embodiments, a resistive output stage can be useful for pulses with voltages greater than about 1.5 kV, frequencies greater than about 10 kHz, pulses widths less than about 100 µs, and/or rise and fall times shorter than about 1 µs. In some embodiments, a resistive output stage can be useful, for example, where the load ZL contains capacitances (e.g., including stray, equivalent, effective, etc., or things that would be modeled as capacitances) with values smaller than 1 µF. In some embodiments, a resistive output stage can be used with a high voltage pulser for the production of plasmas (which will typically have the plasma and/or electrode/grid scale size less than 1 m or an electrode grid scale less than about 1 square meter) or involve grids and plates with scale sizes less than 1 m.

Figure 5:
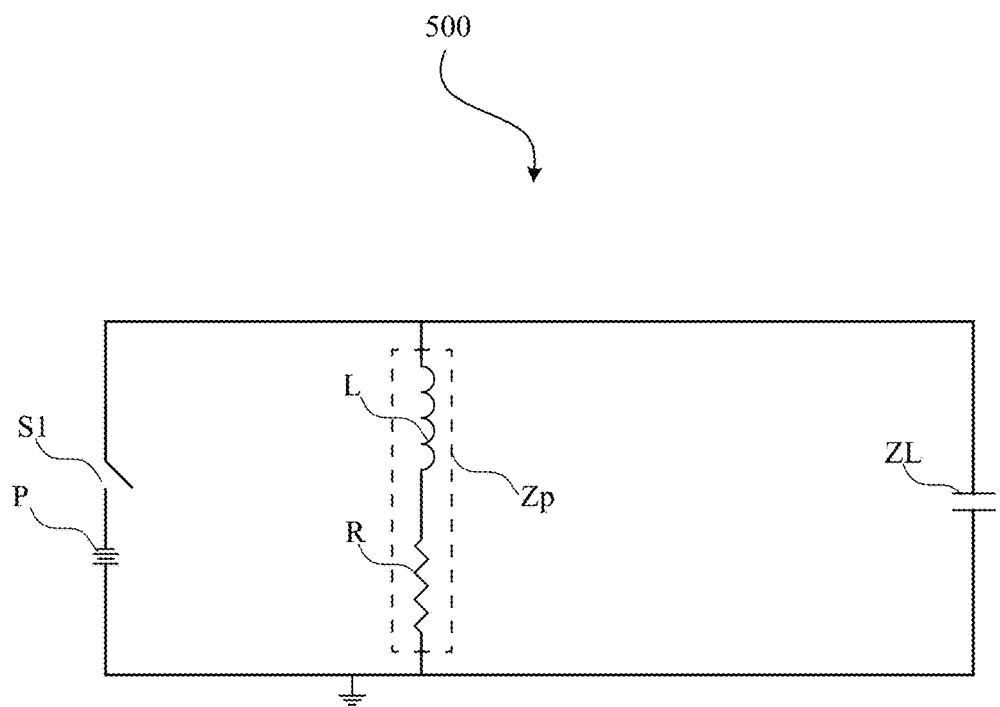
FIG. 5 is an example circuit with a resistive output stage according to some embodiments.

FIG. 5 is another example circuit 500. In circuit 500, circuit element Zp includes resistor R in series with inductor L. In this example, inductor L can be used to reduce the power that flows into resistor R while the switch S1 is closed on short time scales such as, for example, on time scales as can be determined by V=Ldi/dt (e.g., 1 ns, 10 ns, 50 ns, 100 ns, 250 ns, 500 ns, 1,000 ns, etc.). Inductor L, for example, can be selected to create a faster fall time and/or faster rise time than could be achieved for a given value of R.

In some embodiments, circuit element Zp can be used to remove voltage/charge from a load ZL in a parameter space not readily accessible to solid-state switches. This parameter space, for example, may include pulses with high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.). ZL may be largely capacitive in nature, and/or may contain capacitance, and/or may represent a capacitance of a wafer and/or plasma. ZL may represent any type of capacitive load.

In some embodiments, voltage waveforms can be produced with a single switch (or single group of switches) when other topologies might require two-switches (or two groups of switches) to achieve a similar result. For instance, in some embodiments, a single switch (or single group of switches) on the input can provide a solution to a problem that generally requires two-switches to solve.

The set of loads ZL where the circuit element Zp may be applicable may include loads that generally have a sufficiently high impedance that the load holds charge/voltage for a longer timescale than desired (e.g., where desired time scales are on the order of 1 ns, 10 ns, 50 ns, 100 ns, 250 ns, 500 ns, 1,000 ns, etc.). In some embodiments, circuit element Zp may allow for rapid removal of this charge/voltage to achieve fast fall times, high frequencies, and/or short pulses.

In some embodiments, a load (e.g., capacitive load CL or generalized load ZL) may include capacitive loads, electrodes, plasma loads, dielectric barriers, semiconductor fabrication plasmas, semiconductor loads, grids, medical loads, etc. Such loads may, for example, have a high impedance compared to the timescale on which charge/voltage needs to be removed from them, such that the load itself does not naturally produce the needed voltage/charge removal timescale.

In some embodiments, a load may have stray elements that have a high impedance compared to the timescale on which charge/voltage needs to be removed from them. For example, if the load ZL is non-capacitive, but the load ZL is associated with a parallel stray capacitance, then circuit element Zp can be used to remove charge/voltage from the stray capacitance, thus allowing the voltage on the load ZL to fall.

In circuits operating at low voltage, it is often common and easy to have pulse generators that both source and sink current, for example 'data pulsers'. Thus, it does not matter if the load has a high impedance compared to the timescale on which charge/voltage needs to be removed from it. The low voltage pulse generator naturally does this by both sourcing and sinking current, often through the use of two switches, where one delivers charge/voltage from a power supply, and the other sinks charge/voltage to ground. At high voltage, high frequency with short pulse widths and/or fast rise time and/or fall times, such sourcing and sinking power supplies often do not exist. A resistive output stage may, for example, allow for the sinking of current from the load, and when used in combination with a high voltage pulser that sources current, allows the equivalent low voltage sourcing and sinking power supply to be realized, but at high voltage, high frequency with short pulse widths and/or fast rise times and/or fast fall times.

The use of a resistive output stage to achieve high voltage pulses at high frequencies that have fast rise/fall times, and short pulse widths may constrain the selection of the circuit elements in the resistive output sage. The resistive output stage may be selected to handle high average power, high peak power, fast rise times and/or fast fall times. For example, the average power rating might be greater than about 0.5 kW, 1.0 kW, 10 kW, 25 kW, etc., the peak power rating might be greater than about 1 kW, 10 kW, 100 kW, 1 MW, etc., and/or the rise and fall times might be less than 1000 ns, 100 ns, 10 ns, or 1 ns.

The high average power and/or peak power requirement may arise both from the need to dissipate stored energy in the load rapidly, and/or the need to do so at high frequency. For example, if the load is capacitive in nature, with a 1 nF capacitance that needs discharging in 20 ns, and if the resistive output stage may be purely resistive, the resistive output stage may have a resistance value of about 20 Ohms. If the high voltage pulse applied to the load is 100 ns long at 20 kV, then each pulse will dissipate about 2 J during the 100 ns pulse width (e.g., $E=t_p V^2/R$) and an additional 0.2 J draining the stored energy from the 1 nF capacitive load (e.g., $E=\frac{1}{2}t_p CV^2$), where $t_p$ is the pulse width, V is the pulse voltage, R is the resistance of the resistive output stage, C is the capacitance of the load, and E is the energy. If operated at 10 kHz, the total per pulse energy dissipation of 2.2 J may result in an average power dissipation of 22 kW into the resistive output stage. The peak power dissipation in the resistive output stage during the pulse may be about 20 MW, and may be calculated from Power=$V^2/R$.

The high frequency and high voltage operation, combined with the need for the resistance in the resistive output stage to be small, for example, may lead to examples with either or both high peak power and high average power dissipation within the resistive output stage. Standard pulldown resistors that are used in TTL type electrical circuits and/or data acquisition type circuits (e.g., around 5 volts) usually operate far below 1 W for both average and peak power dissipation.

In some embodiments, the ratio of the power the resistive output stage dissipates compared to the total power dissipated by the load may be 10%, 20% 30% or greater, for example. In standard low voltage electronic circuits, pull down resistors dissipate less than 1% of the power consumed, and typically much less.

The fast rise time and/or fast fall time requirements may constrain both the allowable stray inductance and/or stray capacitance within the resistive output stage. In the above example, for the 1 nF capacitive load to be discharged in around 20 ns, the series stray inductance in the resistive output stage may be less than around 300 nH. For the resistive output stage to not waste significant additional energy due to its stray capacitance, for example, less than 10% of the capacitive energy stored in the load capacitance, then the stray capacitance of the resistive output stage may be less than 100 pF. Since the resistive output stage may tend to be physically large due to its high power dissipation requirements, realizing both this low stray inductance and stray capacitance can be challenging. The design generally requires significant parallel and series operation using numerous discrete components (e.g., resistors), with the components tightly grouped together, and/or spaced far from any grounded surfaces that could significantly increase the stray capacitance.

In some embodiments, a resistive output stage circuit can be used in a dielectric barrier discharge device being driven with a high voltage pulser. The load in a dielectric barrier discharge can be dominantly capacitive. In some embodiments, the load may be modeled as a purely capacitive load CL, for example, like a dielectric barrier discharge. For example, when the power supply P is switched on, capacitive load CL may be charged, when power supply P is not switched on, the charge on capacitive load CL may be drained through resistor R. In addition, due to high voltages and/or high frequencies and/or fast fall time requirements a resistive output stage may need to discharge a significant amount of charge from the capacitive load CL quickly, which may not be the case with low voltage applications (e.g., standard 5 V logic levels and or low voltage data pulsers).

For example, a typical dielectric barrier discharge device might have a capacitance of about 10 pF and/or may be driven to about 20 kV with about a 20 ns rise time and/or about a 20 ns fall time. In some embodiments, the desired pulse width might be 80 ns long. For the fall time to match the rise time, a circuit element Zp of about 2 kOhms can be used to create the desired fall time. Various other values for the circuit element Zp may be used depending on the load and/or the other circuit elements and/or the requirements rise time, fall time, and/or pulse width, etc.

In some embodiments, for a capacitive like load, or a load that has an effective capacitance C (e.g., the capacitance C can be due to the load ZL itself or to additional stray elements), the characteristic pulse fall time can be designated as $t_f$ and the pulse rise time can be designated by $t_r$. In some embodiments, the rise time $t_r$ can be set by the specifics of the driving power supply. In some embodiments, the pulse fall time $t_f$ can be approximately matched to the pulse rise time $t_r$ by selecting the circuit element Zp as a resistor R, where circuit element $Zp=R=t_f/C$. In some embodiments, the circuit element Zp can be specifically selected to provide a specific relation between the pulse rise time $t_r$ and the pulse fall time $t_f$. This is different from the concept of a pull down resistor, where in general, a pull down resistor is selected to carry/dissipate voltage/charge on some longer time scale, and at much lower power levels. Circuit element Zp, in some embodiments, can be specifically used as an alternative to a pull down switch, to establish a specific relation between the pulse rise time $t_r$ and the pulse fall time $t_f$.

In some embodiments, if the circuit element Zp is a resistor R, then the power dissipated in circuit element Zp during a pulse having a pulse width $t_p$ and a drive voltage V can be found from $P=V^2/R$. Because fall time $t_f$ is directly proportional to resistance R (e.g., $R=t_f/C$), as the requirement for fall time $t_f$ decreases then the requirement for the resistance R also decreases, and the power P dissipated in circuit element Zp increases according to $P=V^2C/t_f$. Thus, circuit element Zp may be designed to ensure the proper fall time $t_f$ yet be capable of handling high power such as, for example, power greater than about 1.0 kW, or 100 kW. In some embodiments the resistor may handle the average power requirements as well as peak power requirements. The need for fast fall time $t_f$ resulting in low resistance values and the resulting high power dissipation are challenges that can make resistive output stages undesirable as a way to quickly remove charge from a capacitive load CL. In some embodiments, a resistor R can include a resistor with low resistance and yet have a high average power rating and peak power rating. In some embodiments, the resistor R may include a parallel stack of resistors that collectively have the required resistance and power rating. In some embodiments, the resistor R may include a resistor have a resistance less than about 2000 ohms, 500 ohms, 250 ohms, 100 ohms, 50 ohms, 25 ohms, 10 ohms, 1 ohm, 0.5 ohms, 0.25 ohms, etc., and have an average power rating greater than about 0.5 kW, 1.0 kW, 10 kW, 25 kW, etc., and have a peak power rating greater than about 1 kW, 10 kW, 100 kW, 1 MW, etc.

Using the example above, with tp=80 ns, V=20 kV, and circuit element Zp set to 2 kOhms, each pulse applied to the load may dissipate 16 mJ once the capacitance in the load is fully charged. Once the pulse is turned off, charge from the load is dissipated by Zp. If operated at 100 kHz, then circuit element Zp may dissipate 1.6 kW. If circuit element Zp had been selected to create a 10 ns $t_f$, then the power dissipated in circuit element Zp would be 3.2 kW. In some embodiments, a high voltage pulse width may extend to 500 ns. At 500 ns with $t_f$=20 ns, circuit element Zp would dissipate 10 kW.

In some embodiments, the power dissipated in the circuit element Zp can be considered large if it exceeds 10% or 20% of the power consumed by the load ZL.

When fast fall times $t_f$ are needed, then the power dissipation can be large such as, for example, about one third the total power consumed. If circuit element Zp, for example, includes a resistor R in series with an inductor L, then inductor L can, for example, reduce the power flow into the resistor R while the voltage V is present and/or hasten the fall time beyond that set by an RC decay.

For example, the time constant L/R can be set to approximately the pulse width $t_p$, for example, $L/R \approx t_p$. This, for example, may reduce energy dissipation and/or shorten the fall time $t_f$ (e.g., decreases $t_f$). In some embodiments, $R \approx C/t_f \approx C/t_r$, assuming one wanted to match $t_f$ to $t_r$. In this application, disclosure, and/or claims, the symbol "$\approx$" means within a factor of ten.

As another example, a load ZL can include a circuit that controls the ion energy in a plasma chamber of a semiconductor wafer fabrication device. FIG. 6, FIG. 7, FIG. 9, and FIG. 11 and FIG. 13 each represent introducing high voltage pulses into a plasma. Some of these example circuits, apply high voltage pulses in a manner that controls the ion energy within the plasma, and specifically that controls the energy the ions have as they exit the plasma and impact, for example, a wafer or other substrate that bounds the plasma.

Figure 6:
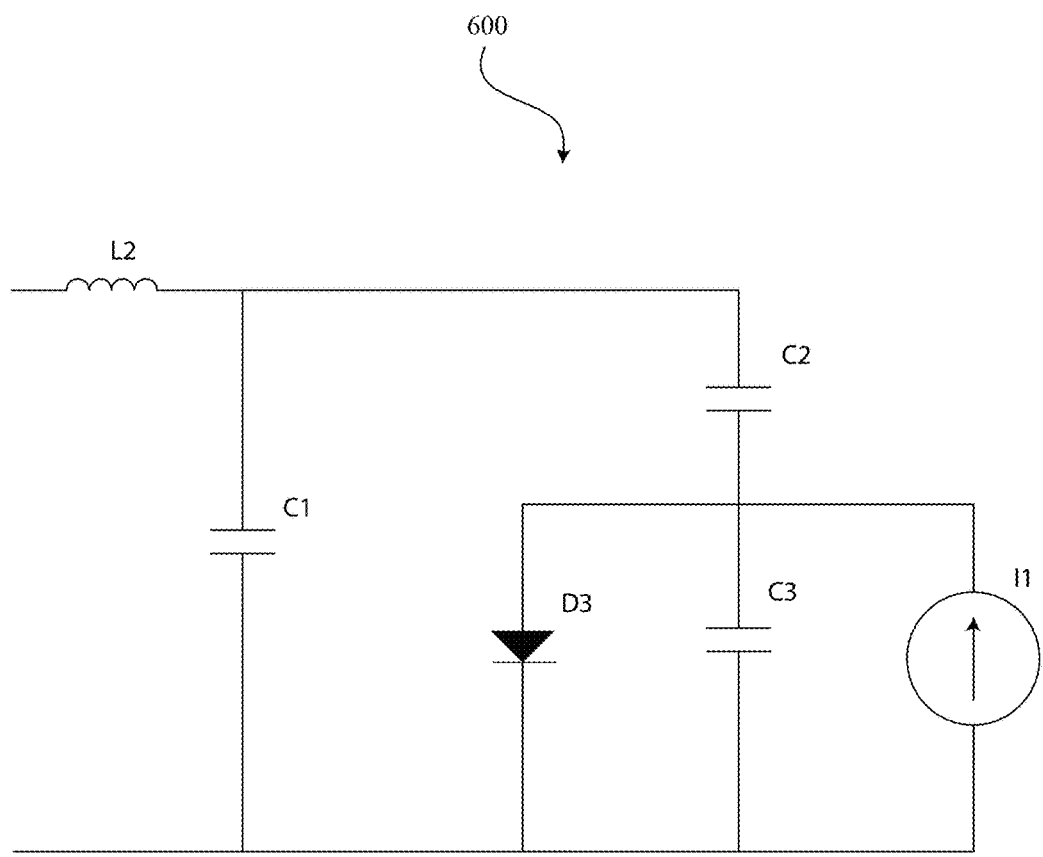
FIG. 6 is an example circuit representation of a circuit used to set the ion energy in a plasma according to some embodiments.

FIG. 6 is one example of a circuit 600 representing a circuit used to set the ion energy in a plasma chamber of a semiconductor wafer fabrication device. The driving waveform may include high voltage and high frequency short pulses with a high duty cycle and fast rise times and fall times. The pulses create a negative bias within the plasma that accelerates ions to the desired potential, prior to their impact with a wafer. An example of such a waveform is shown as waveform 810 in FIG. 8. In waveform 810, a steady negative bias of approximately −4 kV is realized, through the use of short positive going pulses shown by waveform 805. The driving waveform to the plasma may include any circuit described in this document where the plasma is the load.

The capacitor C2 represents the capacitance of the dielectric material upon which a semiconductor wafer sits during fabrication. The capacitor C3 represents the sheath capacitance between a semiconductor surface and a plasma. The current source I1 represents the current of positive ions moving from the plasma toward the surface of the wafer. In this example, a portion of the plasma is electrically connected to ground. Thus, a negative electric potential in the plasma between ground and the surface of the wafer will induce positive ions to flow and impact the surface of the wafer. The capacitor C1 represents the capacitance of leads running into the chamber, as well as other stray capacitive elements. In some embodiments, capacitor C1 may have a capacitance of about 40-4,000 pF (e.g., 400 pF), capacitor C2 may have a capacitance of about 0.7-70 nF (e.g., 7 nF), capacitor C3 may have a capacitance of about 10-1,000 pF (e.g., 100 pF), and current source I1 may produce current of about 300 mA-30 A (e.g., 3 A). Various other values may be used. Component values within an order of magnitude or so of these element values given may also be used.

In some embodiments, the capacitance of the capacitor C1 is almost the same size as the capacitance of the capacitor C3; and the capacitance of the capacitor C2 is large in comparison with the capacitance of the capacitor C3.

Figure 7:
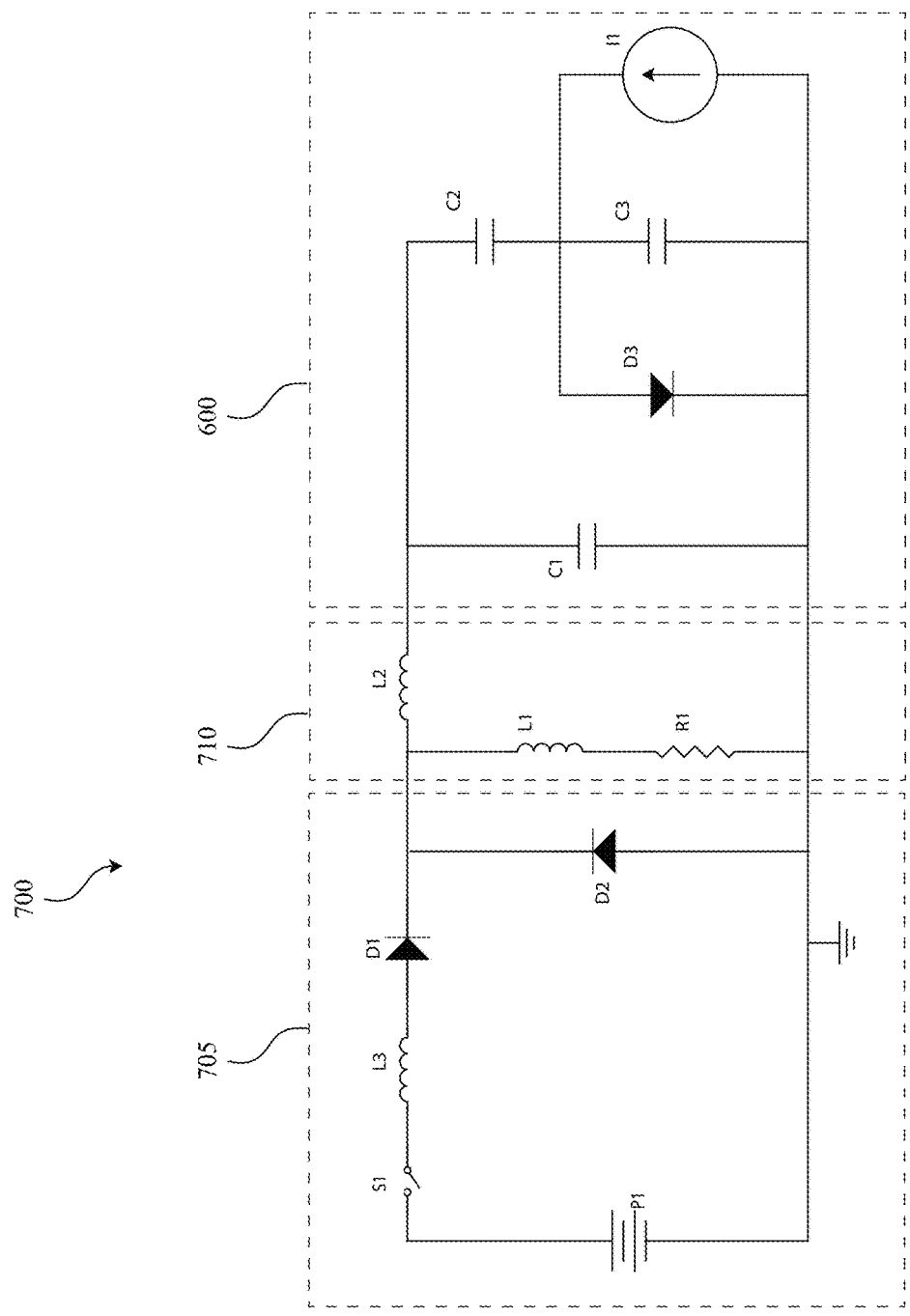
FIG. 7 is a single switch configuration that may be used instead of the two-switch configuration, to set the ion energy in a plasma, according to some embodiments.

FIG. 7 is a circuit diagram of circuit 700 that includes a pulser 705, a resistive output stage 710, that produces high voltage pluses in a plasma represented by circuit 600. In this example, the resistive output stage 710 includes inductor L1 and resistor R1. The circuit elements to the left of inductor L1 and resistor R1 comprise one representation of a high voltage pulser 705. In this example, the high voltage pulser 705 can produce a plurality of high voltage pulses with a high frequency and fast rise times and fall times. In all of the circuits shown, the high voltage pulser may comprise a nanosecond pulser.

The various values of the circuit elements in circuit 700 and/or the circuit 600 may vary. For example, the value of capacitor C3 may be about 150 pF, the value of capacitor C1 may be about 400 pF, the value of capacitor C2 may be about 8 nF, the value of inductor L2 may be about 300 nH, the value of resistor R1 may be about 150 Ohms, the value of inductor L1 may be about 6 uH, the value of DC power supply V1 may be about 5 kV, and/or the value of current source I1 may be about 2 A. Values within an order of magnitude or so of these values may also be used.

Figure 8:
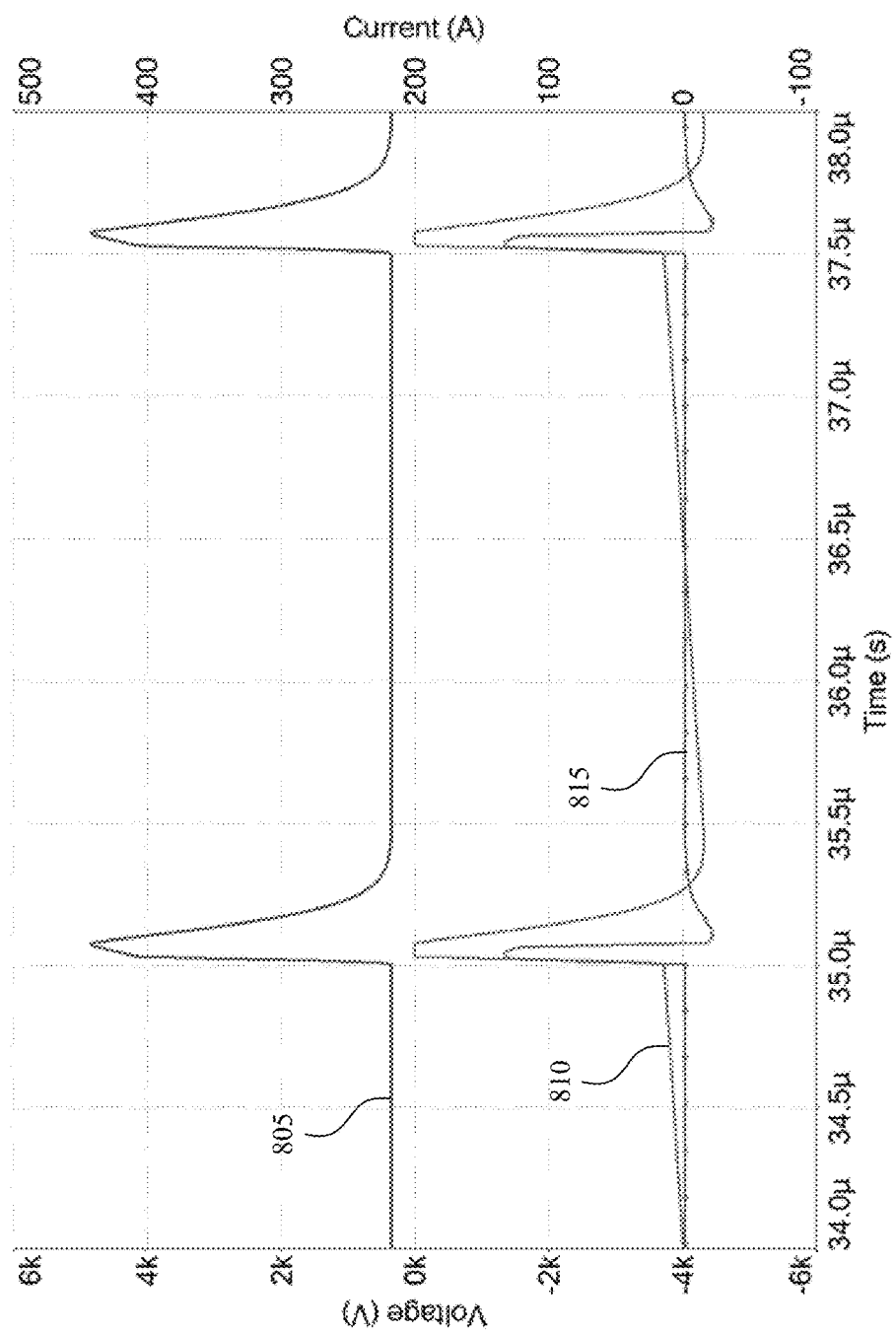
FIG. 8 shows some example waveforms of the voltage and current within a high voltage switching application according to some embodiments.

FIG. 8 shows example waveforms produced in circuit 700. In this example, the pulse waveform 805 may represent the voltage provided by the pulser stage 705. As shown, the pulse waveform 805 produces a pulse with the following qualities: high voltage (e.g., greater than about 4 kV as shown in the waveform), a fast rise time (e.g., less than about 200 ns as shown in the waveform), a fast fall time (e.g., less than about 200 ns as shown in the waveform), and short pulse width (e.g., less than about 300 ns as shown in the waveform). The waveform 810 may represent the voltage at the surface of a wafer represented in circuit 700 by the point between capacitor C2 and capacitor C3 or the voltage across capacitor C3. The pulse waveform 815 represent the current flowing from the pulser 705 to the plasma. The circuit 700 may or may not include either or both diodes D1 or D2.

During the transient state (e.g., during an initial number of pulses not shown in the figure), the high voltage pulses from the pulser 705 charge the capacitor C2. Because the capacitance of capacitor C2 is large compared to the capacitance of capacitor C3 and/or capacitor C1, and and/or because of the short pulse widths of the pulses, the capacitor C2 may take a number of pulses from the high voltage pulser to fully charge. Once the capacitor C2 is charged the circuit reaches a steady state, as shown by the waveforms in FIG. 8.

In steady state and when the switch S1 is open, the capacitor C2 is charged and slowly dissipates through the resistive output stage 710, as shown by the slightly rising slope of waveform 810. Once the capacitor C2 is charged and while the switch S1 is open, the voltage at the surface of the waver (the point between capacitor C2 and capacitor C3) is negative. This negative voltage may be the negative value of the voltage of the pulses provided by the pulser 705. For the example waveform shown in FIG. 8, the voltage of each pulse is about 4 kV; and the steady state voltage at the wafer is about −4 kV. This results in a negative potential across the plasma (e.g., across capacitor C3) that accelerates positive ions from the plasma to the surface of the wafer. While the switch S1 is open, the charge on capacitor C2 slowly dissipates through the resistive output stage.

When the switch S1 is closed, the voltage across the capacitor C2 may flip (the pulse from the pulser is high as shown in waveform 805) as the capacitor C2 is charged. In addition, the voltage at the point between capacitor C2 and capacitor C3 (e.g., at the surface of the wafer) changes to about zero as the capacitor C2 charges, as shown in waveform 810. Thus, the pulses from the high voltage pulser produce a plasma potential (e.g., a potential in a plasma) that rise from a negative high voltage to zero and returns to the negative high voltage at high frequencies, with fast rise times, fast fall times, and/or short pulse widths.

In some embodiments, the action of the resistive output stage, elements represented by block 710, that may rapidly discharge the stray capacitance C1, and may allow the voltage at the point between capacitor C2 and capacitor C3 to rapidly return to its steady negative value of about −4 kV as shown by waveform 810. The resistive output stage may allow the voltage at the point between capacitor C2 and capacitor C3 to exists for about 90% of the time, and thus maximizes the time which ions are accelerated into the wafer. In some embodiments, the components contained within the resistive output stage may be specifically selected to optimize the time during which the ions are accelerated into the wafer, and to hold the voltage during this time approximately constant. Thus, for example, a short pulse with fast rise time and a fast fall time may be useful, so there can be a long period of fairly uniform negative potential.

Figure 9:
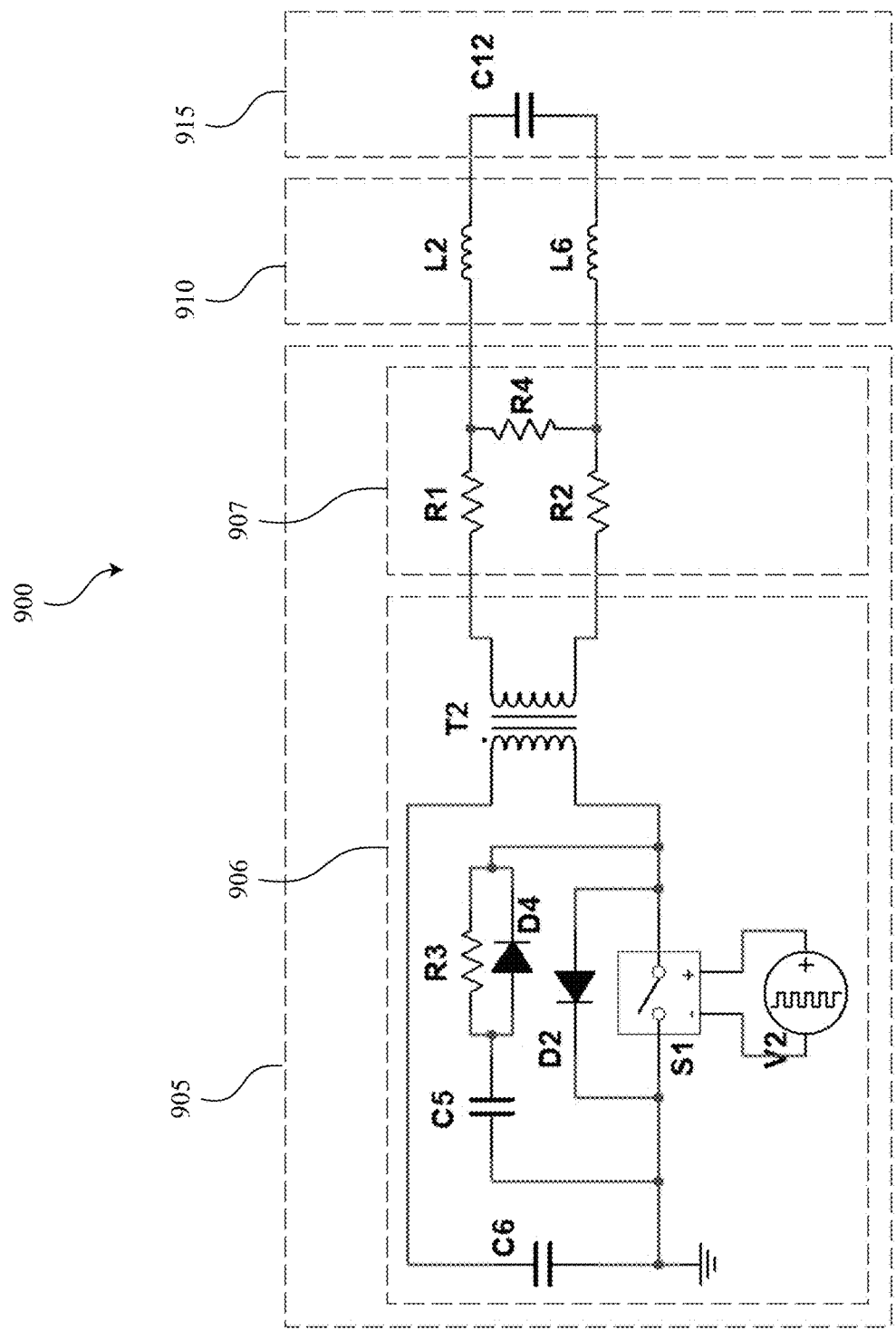
FIG. 9 is a circuit diagram of a circuit with a resistive output stage according to some embodiments.

FIG. 9 shows another example circuit 900 according to some embodiments. The circuit 900 can be generalized into three stages (these stages could be broken down into other stages or generalized into fewer stages). The circuit 900 includes pulser stage 905, a lead stage 910, and a load stage 915. The pulser stage 905 may include pulser and transformer stage 906 and a resistive output stage 907.

In some embodiments, the load stage 915 may include a capacitive load C12. The capacitance of the capacitive load C12 may be on the order of about 10 pF. Some examples of a capacitive load may include a dielectric barrier discharge, a semiconductor fabrication device, a capacitive device, a photoconductive switch, a dielectric barrier discharge device, etc. In some embodiments, C12 may be a high voltage grid for ion beams, neutral beams, or any other accelerator or grid for producing rapidly changing electric fields. In some embodiments, the capacitor C12 may be a stripline kicker.

The pulser stage 905 may include a pulser and transformer stage 906. The pulser and transformer stage 906 may produce pulses with high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

In this example, the resistive output stage 907 includes three resistors: resistor R1, resistor R2, and resistor R4. In some embodiments, resistor R1 and resistor R2 may have the same resistance values. In some embodiments, resistor R1 and resistor R2 can be selected for a number of purposes. For example, resistor R1 and resistor R2 can have resistance levels selected to limit the current flowing from the pulser stage 905 to the load stage 915. As another example, resistor R1 and resistor R2 can have resistance levels selected to determine the rise time $t_r$ and the fall time $t_f$, which may also depend on the inductance in the lead stage 910 (e.g., inductor L2 and inductor L6) and/or the capacitance of the load stage (e.g., capacitance C12). In some embodiments, the resistance values of resistor R1 and resistor R2 can be set based on a specific application. In some embodiments, resistor R1 and resistor R2 can be used to protect against load shorts such that all the current from the pulse and transformer circuit 906 can be dissipated in resistor R1 and resistor R2. In some embodiments, resistor R2 and/or inductor L6 may be set to approximately zero, such that their side of C12 can be ground referenced.

A pulse from the pulser and transformer stage 905 may charge the capacitive load C12 in the load stage 915. While the pulse is charging the capacitive load C12, most of the current may charge the capacitive load C12, and some current may flow through resistor R4. Once the capacitive load C12 is fully charged, most if not all the current flows through resistor R4. Because of the high voltages applied by the pulser and transformer stage 905 and noting that the power dissipated through resistor R4 is inversely proportional to the resistance of resistor R4, resistor R4 may have a high power rating (e.g., both average power and peak power). In some embodiments, the resistance value of R4 can be selected in conjunction with the value of the load capacitance C12 so that the fall time $t_f$ can be fast e.g., less than 1 ns, 10 ns, 50 ns, 100 ns, 250 ns, 500 ns, 1,000 ns, etc.

Figure 10:
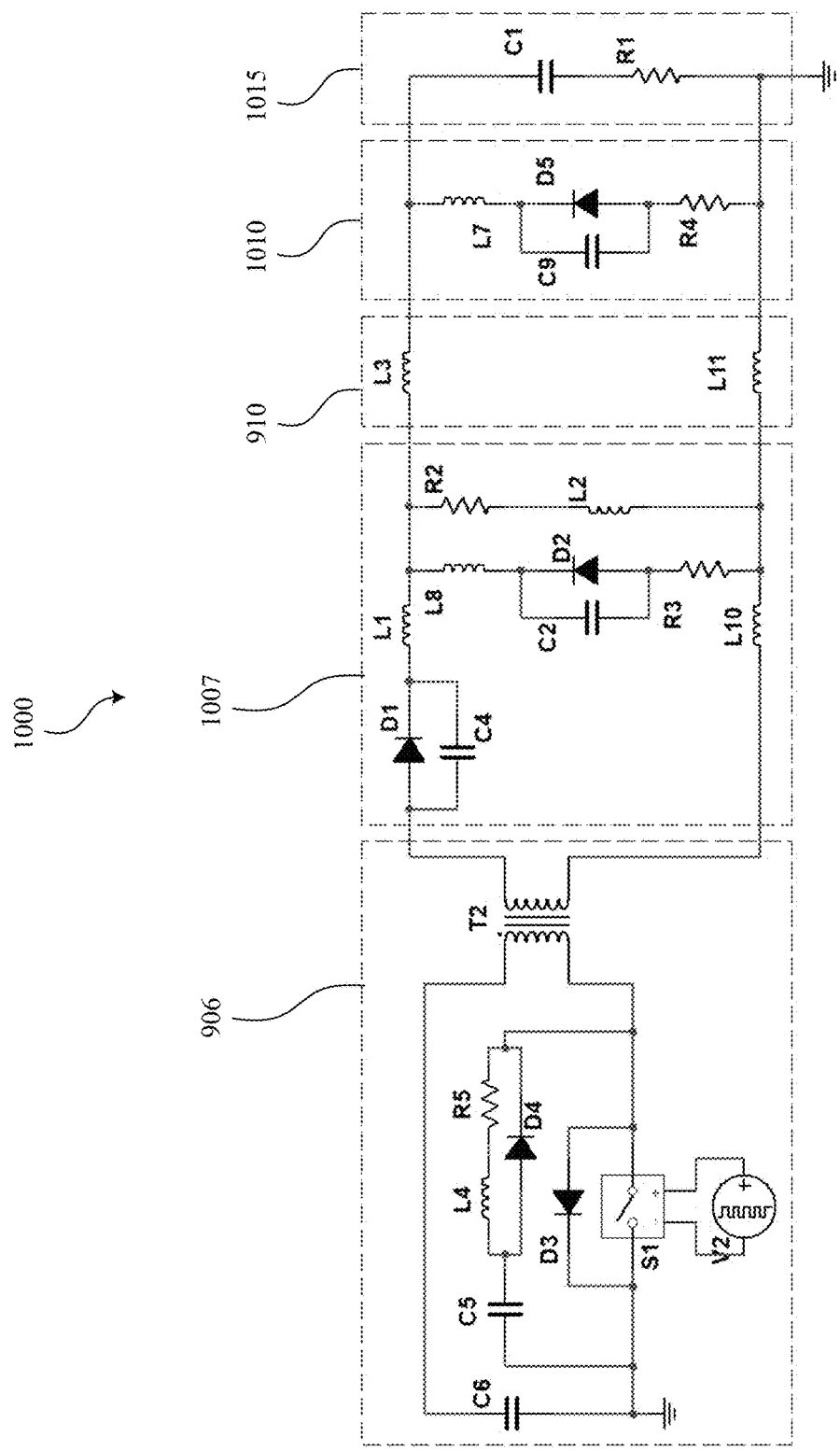
FIG. 10 is an example circuit with a resistive output stage according to some embodiments.

FIG. 10 is another example circuit 1000 according to some embodiments. The circuit 1000 can be generalized into five stages (these stages could be broken down into other stages or generalized into fewer stages). The circuit 1000 includes pulser and transformer stage 906, a resistive output stage 1007, a lead stage 910, load crowbar stage 1010, and a load stage 1015.

The pulser and transformer stage 906 are as described in FIG. 9.

In this example, the resistive output stage 1007 may include a blocking diode D1 that can ensure that current from the load stage 1015 (or from anywhere else) does not flow back into the pulser and transformer stage 906. The capacitor C4 may represent the stray capacitance of the blocking diode D1.

In some embodiments, the resistive output stage 1007 may include one or more inductive elements represented by inductor L1, inductor L2, inductor L8, and/or inductor L10. These inductive elements may, for example, limit current flow from the capacitive load in the load stage 1015. In some embodiments, the resistor R2 may dissipate charge from the capacitive load C1 in the load stage 1015, for example, on fast time scales (e.g., 1 ns, 10 ns, 50 ns, 100 ns, 250 ns, 500 ns, 1,000 ns, etc. time scales). The resistance of resistor R2 may be low to ensure the pulse across the load stage 1015 has a fast fall time t, for example a fall time less than 1 ns, 10 ns, 100 ns, or 1000 ns. The inductive elements, for example, inductor L2 may limit the current flow through resistor R2, and may increase the overall circuit efficiency.

In this example, the load crowbar stage 1010, includes a diode D5 which may ensure that the current to the load stage 1015 does not reverse polarity. In some embodiments, the stray inductance of the crowbar stage 1010 is represented by L7 and the stray capacitance of the diode D5 is represented by C9. In some embodiments, stray resistance of the crowbar stage 1010 may be represented by resistor R4. Resistance R4 may be intentionally added to create voltage waveforms of a particular desired shape across load 1015.

In this example, the load stage 1015 may include either or both resistive and capacitance elements represented by resistor R1 and capacitor C1. The capacitance of capacitor C1 may, for example, be on the order of about 10 nF. Some examples of a capacitive and resistive load may include a charging a capacitor for energy storage purposes in a photoconductive switch which may be used to produce high power microwaves. In such circuits, it is important that the load capacitance only be charged for short periods of time, and the resistive output stage provides a path to rapidly remove (sink) charge from the load should it not otherwise be removed by the action of other circuit elements that are not shown in this figure. The resistive output stage may also ensure that the voltage across C1 is constant at the start of every charge cycle, assuming the charge repetition rate is slow compared to the discharge rate of C1 through the resistive output stage. In this example, the resistive output stage rapidly returns the potential across C1 to zero.

Figure 11:
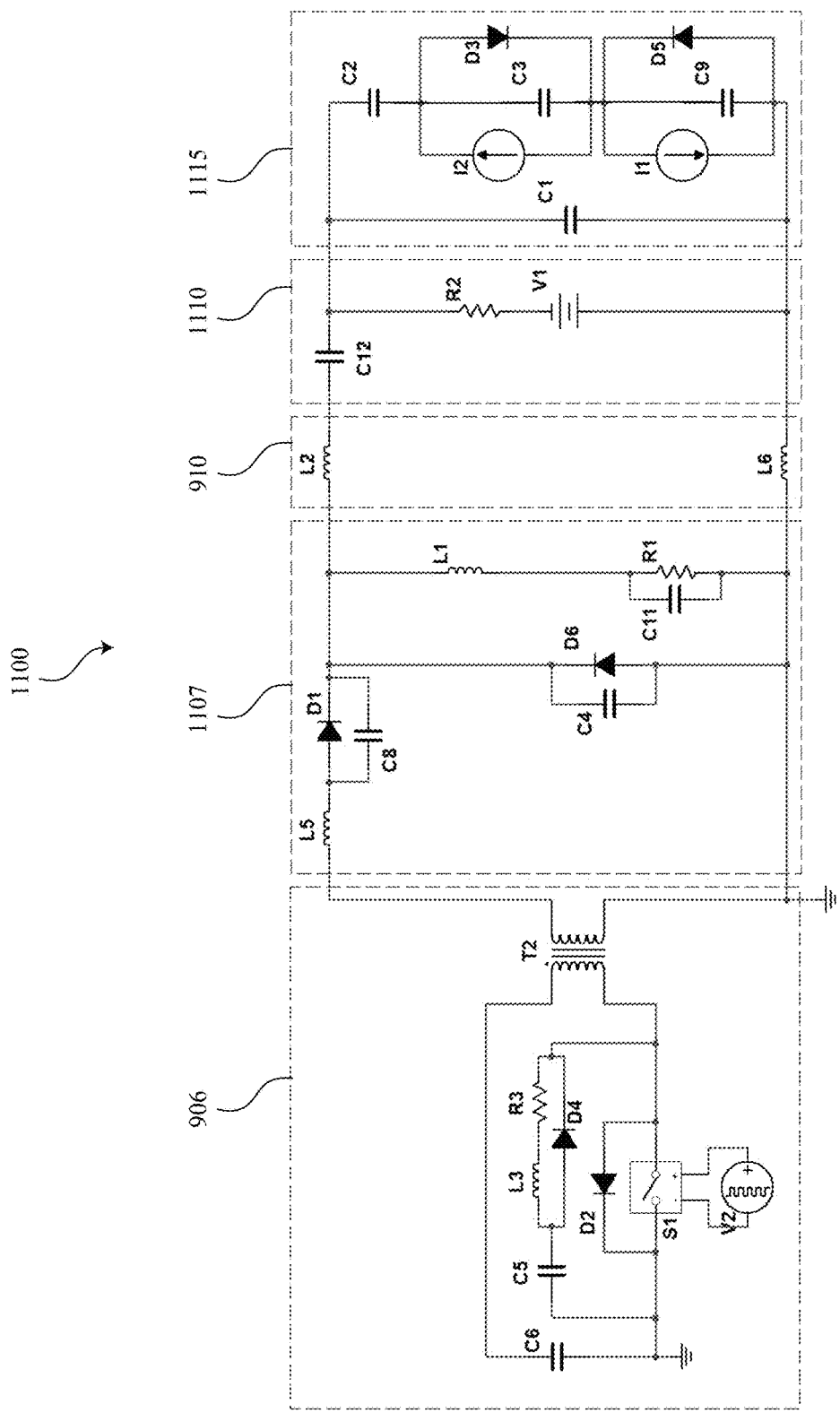
FIG. 11 is an example circuit with a resistive output stage according to some embodiments.

FIG. 11 shows another example circuit 1100 according to some embodiments. The circuit 1100 can be generalized into five stages (these stages could be broken down into other stages or generalized into fewer stages). The circuit 1100 includes pulser and transformer stage 906, a resistive output stage 1107, a lead stage 910, a DC bias power supply stage 1110, and a load stage 1115.

In this example, the load stage 1115 may represent an effective circuit for a plasma deposition system, plasma etch system, or plasma sputtering system. The capacitance C2 may represent the capacitance of the dielectric material upon which a wafer may sit. The capacitor C3 may represent the sheath capacitance of the plasma to the wafer. The capacitor C9 may represent capacitance within the plasma between a chamber wall and the top surface of the wafer. The current source I2 and the current source I1 may represent the ion current through the sheath.

In this example, the resistive output stage 1107 may include one or more inductive elements represented by inductor L1 and/or inductor L5. The inductor L5, for example, may represent the stray inductance of the leads in the resistive output stage 1107. Inductor L1 may be set to minimize the power that flows directly from the high voltage supply 906 into resistor R1.

In some embodiments, the resistor R1 may dissipate charge from the load stage 1115, for example, on fast time scales (e.g., 1 ns, 10 ns, 50 ns, 100 ns, 250 ns, 500 ns, 1,000 ns, etc. time scales). The resistance of resistor R1 may be low to ensure the pulse across the load stage 1115 has a fast fall time $t_f$.

In some embodiments, the resistor R1 may include a plurality of resistors arranged in series and/or parallel. The capacitor C11 may represent the stray capacitance of the resistor R1 including the capacitance of the arrangement series and/or parallel resistors. The capacitance of stray capacitance C11, for example, may be less than 500 pF, 250 pF, 100 pF, 50 pF, 10 pF, 1 pF, etc. The capacitance of stray capacitance C11, for example, may be less than the load capacitance such as, for example, less than the capacitance of C2, C3, and/or C9.

In some embodiments, a plurality of pulser and transformer stages 906 can be ganged up in parallel and coupled with the resistive output stage 1107 across the inductor L1 and/or the resistor R1. Each of the plurality of pulser and transformer stages 906 may each also include diode D1 and/or diode D6.

In some embodiments, the capacitor C8 may represent the stray capacitance of the blocking diode D1. In some embodiments, the capacitor C4 may represent the stray capacitance of the diode D6.

In some embodiments, the DC bias power supply stage 1110 may include DC a voltage source V1 that can be used to bias the output voltage either positively or negatively. In some embodiments, the capacitor C12 isolates/separates the DC bias voltage from the resistive output stage and other circuit elements. It allows for a potential shift from one portion of the circuit to another. In some applications the potential shift it establishes is used to hold a wafer in place. Resistance R2 may protect/isolate the DC bias supply from the high voltage pulsed output from circuit component group 906

Figure 12:
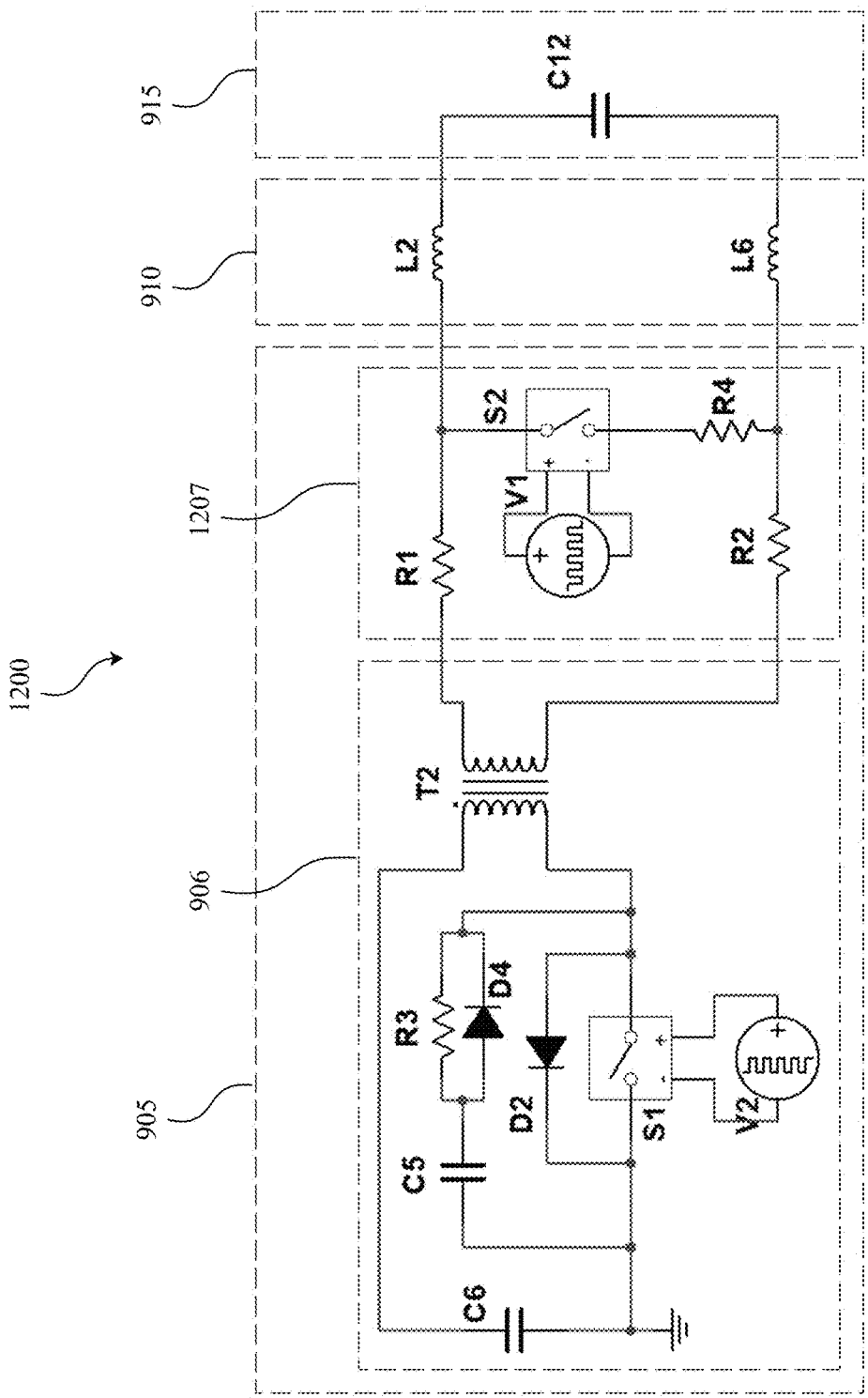
FIG. 12 is an example circuit with a resistive output stage according to some embodiments.

FIG. 12 shows another example circuit 1200 according to some embodiments. Circuit 1200 is similar to circuit 900 shown in FIG. 9. Resistive output stage 1207, in this example, however, includes switch S2, which may open and close based on a signal from voltage supply V1. The switch S2, for example, may be open while the load stage 915 is being charged by a signal from the pulser and transformer stage 906 such as, for example, when the switch(es) S1 in pulser and transformer stage 906 is closed. The switch S2, for example, may be closed to discharge any charge in the load stage 915 such as, for example, when the switch(es) S1 in pulser and transformer stage 906 is open. Because of the high voltages applied to the load stage 915, the voltages applied across the switch S2 will be large requiring a switch that is rated for high voltages. In addition, to allow for fast rise times and fast fall times at the load stage 915, the switch S2 may be required to switch quickly. Resistor R1 and resistor R2 may be small, and may represent stray resistance contained within conductors and cables. Resistor R4 may be selected to set a particular fall time for the energy/voltage dissipation from the load.

In another example, resistor R2 and inductor L6 may be about zero. This may allow the low side to be ground referenced, and may effectively create a single sided circuit topology instead of the differential output topology shown.

Figure 13:
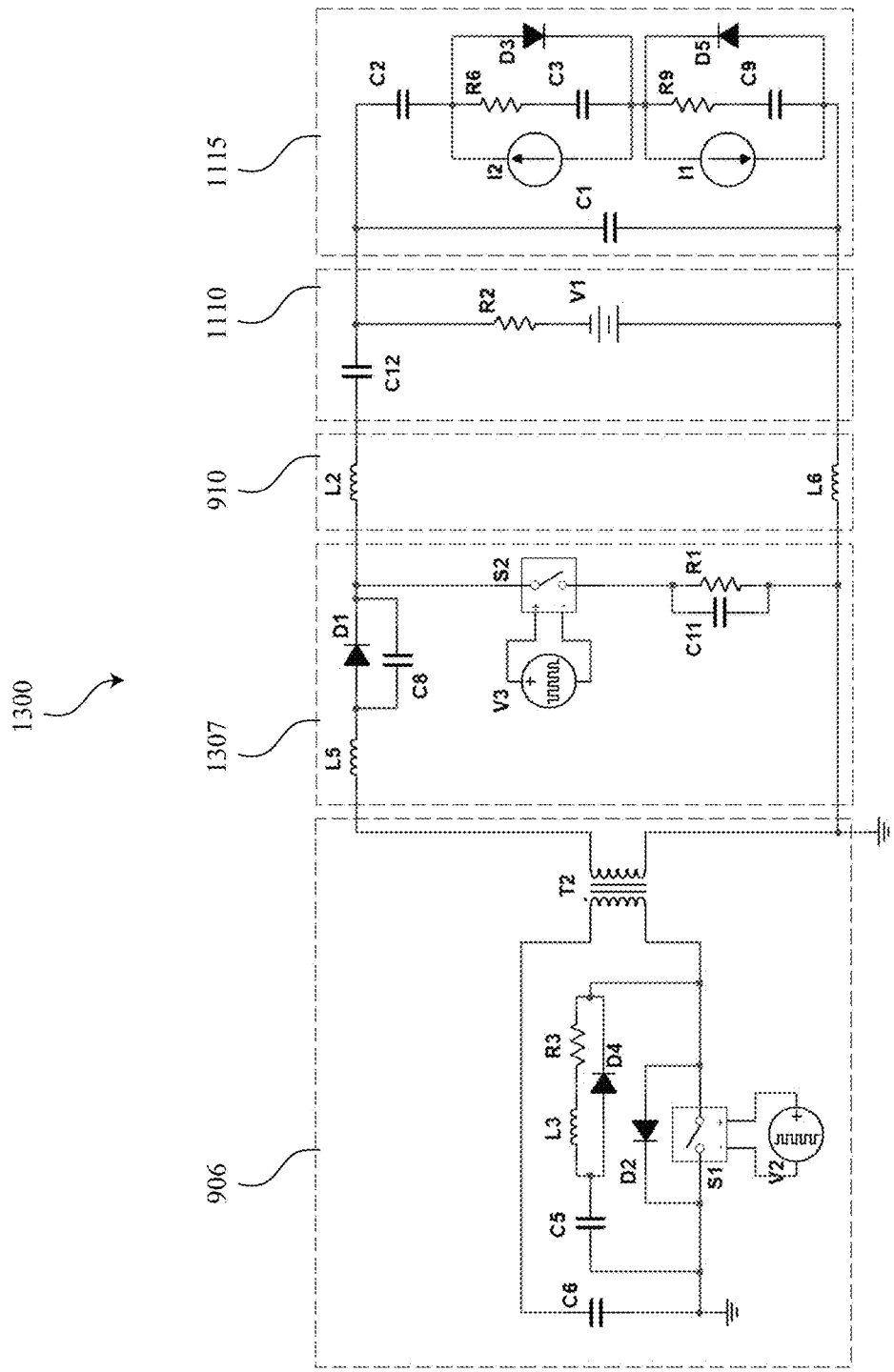
FIG. 13 is an example circuit with a resistive output stage according to some embodiments.

FIG. 13 shows another example circuit 1300. Circuit 1300 is similar to circuit 1100 shown in FIG. 11. Resistive output stage 1307, in this example, however, includes switch S2, which may open and close based on a signal from voltage supply V1. The switch S2, for example, may be open while the load stage 1115 is being charged by a signal from the pulser and transformer stage 906 such as, for example, when the switch(s) S1 in pulser and transformer stage 906 is closed. The switch S2, for example, may be closed to discharge any charge in the load stage 1115 such as, for example, when the switch(s) S1 in pulser and transformer stage 906 is open. Because of the high voltages applied to the load stage 1015, the voltages applied across the switch S2 will be large requiring a switch that is rated for high voltages. In addition, to allow for fast rise times and fast fall times at the load stage 1015, the switch S2 may be required to switch quickly. The resistor R1 may be selected to realize particular circuit rise times and/or fall times.

In some embodiments, the switch S2 described in FIG. 12 and/or FIG. 13 may include a high voltage switch. A high voltage switch may include a plurality of solid-state switches arranged in series.

Some embodiments include a high voltage switching power supply (e.g., switch S1 in FIG. 1 and FIG. 3, switch S1 and power supply P1 in FIG. 2, FIG. 4, and FIG. 5, FIG. 7, FIG., switch S2 and power supply V2 in FIGS. 9-13). Any type of high voltage switching power supply may be used that can produce high voltages at high frequencies with fast rise times and fast fall times. One example of a high voltage switching power supply includes nanosecond pulsers described in U.S. patent application Ser. Nos. 14/542,487, 14/635,991, and 14/798,154, which are incorporated into this document in their entirety for all purposes.

The term "substantially" and/or "about" means within 10% or 20% of the value referred to or within manufacturing tolerances.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

That which is claimed:

1. A high voltage, high frequency switching circuit comprising:
    a high voltage switching power supply that produces pulses having a voltage greater than 1 kV and with frequencies greater than 10 kHz;
    an output; and
    a resistive output stage electrically coupled to and in parallel with the output of the high voltage switching power supply and the output, the resistive output stage has a resistance less than about 2000 ohms, the resistive output stage has a capacitance less than about 500 pF, the resistive output stage is configured to discharge a load coupled with the output that has been charged by the pulses from the high voltage switching power supply, and the resistive output stage configured to dissipate over about 1 kilowatt of average power.

2. The high voltage, high frequency switching circuit according to claim 1, wherein the resistive output stage has a peak power rating greater than 100 kW.

3. The high voltage, high frequency switching circuit according to claim 1, wherein the resistor in the resistive output stage includes a resistance R and the output is coupled with a load having a capacitance C such that $R \approx C/t_f$ where $t_f$ is the pulse fall time.

4. The high voltage, high frequency switching circuit according to claim 1, further comprising an inductor coupled in series with the resistive output stage, the inductor having an inductance less than about 300 nH.

5. The high voltage, high frequency switching circuit according to claim 1, wherein the resistive output stage has an average power rating greater than 1.0 kW.

6. The high voltage, high frequency switching circuit according to claim 1, wherein the resistive output stage is configured to dissipate charge on the load with a rise time less than about 100 ns.

7. The high voltage, high frequency switching circuit according to claim 1, wherein the resistive output stage is configured to dissipate charge on the load with a fall time less than about 100 ns.

8. The high voltage, high frequency switching circuit according to claim 1, wherein the resistive output stage is configured to dissipate charge on the load with pulse widths less than about 250 ns.

9. The high voltage, high frequency switching circuit according to claim 1, further comprising a switch arranged in series with the resistive output stage.

10. The high voltage, high frequency switching circuit according to claim 9, wherein the switch is configured to be open when the high voltage switching power supply is producing a pulse, and is closed when the high voltage switching power supply is not producing a pulse.

11. The high voltage, high frequency switching circuit according to claim 1, further comprising a blocking diode disposed between the high voltage switching power supply and the resistive output stage.

12. A high voltage, high frequency switching circuit comprising:

a high voltage switching power supply that produces pulses having a voltage greater than 1 kV and with frequencies greater than 10 kHz;

an output; and a resistive output stage electrically coupled to, and in parallel with the high voltage switching power supply and the output, the resistive output stage has a resistance less than about 2000 ohms, the resistive output stage has a capacitance less than about 500 pF, the resistive output stage is configured to discharge a load coupled with the output that has been charged by the pulses from the high voltage switching power supply wherein the output can produce a high voltage pulse having a voltage greater than 1 kV and with frequencies greater than 10 kHz and with a pulse fall time less than about 400 ns.

13. The high voltage, high frequency switching circuit according to claim 12, wherein the resistive output stage is configured to dissipate over about 1 kilowatt of power.

14. The high voltage, high frequency switching circuit according to claim 12, wherein the resistive output stage handles a peak power greater than 10 kW.

15. The high voltage, high frequency switching circuit according to claim 12, wherein the resistance of the resistor in the resistive output stage is less than about 400 ohms.

16. The high voltage, high frequency switching circuit according to claim 12, wherein the resistive output stage includes an inductor and a resistor, and wherein the inductance L of the inductor and the resistance R of the resistor are set to satisfy $L/R \approx t_p$, where $t_p$ is the pulse width of the pulse.

17. The high voltage, high frequency switching circuit according to claim 12, wherein the resistive output stage includes a resistance R and the output is coupled with a load having a capacitance C such that $R \approx C/t_f$ where $t_f$ is the pulse fall time.

18. The high voltage, high frequency switching circuit according to claim 12, further comprising an inductor coupled in series with the resistive output stage, the inductor having an inductance less than about 300 nH.

19. The high voltage, high frequency switching circuit according to claim 12, wherein the resistive output stage is configured to dissipate charge on the load with a rise time less than about 100 ns.

20. The high voltage, high frequency switching circuit according to claim 12, wherein the resistive output stage is configured to dissipate charge on the load with a fall time less than about 100 ns.

21. The high voltage, high frequency switching circuit according to claim 12, wherein the resistive output stage is configured to dissipate charge on the load with pulse widths less than about 250 ns.

22. The high voltage, high frequency switching circuit according to claim 12, further comprising a switch arranged in series with the resistive output stage, wherein the switch is configured to be open when the high voltage switching power supply is producing a pulse, and is closed when the high voltage switching power supply is not producing a pulse.

23. The high voltage, high frequency switching circuit according to claim 12, further comprising a blocking diode disposed between the high voltage switching power supply and the resistive output stage.

24. A high voltage, high frequency switching circuit comprising:

a high voltage switching power supply that produces pulses having a voltage greater than 1 kV and with frequencies greater than 10 kHz;

an output; and a resistive output stage electrically coupled to and in parallel with the high voltage switching power supply and the output, the resistive output stage has a resistance less than about 2000 ohms, the resistive output stage has a capacitance less than about 500 pF, the resistive output stage is configured to discharge a load coupled with the output that has been charged by the pulses from the high voltage switching power supply, the resistive output stage comprising at least one resistor, wherein the output can produce a high voltage pulse having a voltage greater than 1 kV with frequencies greater than 10 kHz and with pulse fall times less than about 400 ns, and wherein the output is electrically coupled to a plasma type load.

25. The high voltage, high frequency switching circuit according to claim 24, further comprising an inductor coupled in series with the resistive output stage, the inductor having an inductance less than about 300 nH.

26. The high voltage, high frequency switching circuit according to claim 24, further comprising a switch arranged in series with the resistive output stage.

27. The high voltage, high frequency switching circuit according to claim 24, further comprising a blocking diode disposed between the high voltage switching power supply and the resistive output stage.

28. The high voltage, high frequency switching circuit according to claim 24, further comprising a switch arranged in series with the resistive output stage, wherein the switch is configured to be open when the high voltage switching power supply is producing a pulse, and is closed when the high voltage switching power supply is not producing a pulse.

* * * * *